United States Patent
Wu et al.

(10) Patent No.: US 9,396,793 B2
(45) Date of Patent: Jul. 19, 2016

(54) PHASE CHANGE MEMORY, WRITING METHOD THEREOF AND READING METHOD THEREOF

(71) Applicant: Macronix International Co., Ltd., Hsinchu (TW)

(72) Inventors: Chao-I Wu, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 11 days.

(21) Appl. No.: 14/276,011

(22) Filed: May 13, 2014

(65) Prior Publication Data

US 2014/0376308 A1 Dec. 25, 2014

Related U.S. Application Data

(60) Provisional application No. 61/837,647, filed on Jun. 21, 2013.

(51) Int. Cl.
*G11C 11/00* (2006.01)
*G11C 13/00* (2006.01)

(52) U.S. Cl.
CPC .......... *G11C 13/0004* (2013.01); *G11C 13/004* (2013.01); *G11C 13/0059* (2013.01); *G11C 13/0069* (2013.01); *G11C 13/0035* (2013.01)

(58) Field of Classification Search
CPC .......... G11C 13/0004; G11C 13/0069; G11C 11/5678
USPC ......................... 365/163, 148, 113
See application file for complete search history.

(56) References Cited

U.S. PATENT DOCUMENTS

| | | | | | |
|---|---|---|---|---|---|
| 6,327,183 B1 * | 12/2001 | Pawletko | ............... | G11C 5/147 | |
| | | | | 365/185.18 | |
| 6,687,153 B2 * | 2/2004 | Lowrey | .............. | G11C 11/5678 | |
| | | | | 365/113 | |
| 7,099,180 B1 * | 8/2006 | Dodge | ............... | G11C 13/0004 | |
| | | | | 365/148 | |
| 7,944,740 B2 * | 5/2011 | Lam | .................... | G11C 11/5678 | |
| | | | | 365/148 | |

FOREIGN PATENT DOCUMENTS

WO    2012040680 A1    3/2012

OTHER PUBLICATIONS

TIPO Office Action dated Mar. 14, 2016 in corresponding TW application (No. 103116188).

* cited by examiner

*Primary Examiner* — Connie Yoha
(74) *Attorney, Agent, or Firm* — McClure, Qualey & Rodack, LLP

(57) ABSTRACT

A phase change memory (PCM), a writing method thereof and a reading method thereof are provided. The PCM has a plurality of memory cells. The writing method comprises the following steps. At least one stress pulse is applied for aging at least one of the memory cells. A starting pulse is applied to all of the memory cells of the PCM for decreasing a resistance of each memory cell. A detection pulse is applied to all of the memory cells of the PCM for detecting the resistance of each memory cell. A set pulse is applied to the aged memory cells. A reset pulse is applied to the non-aged memory cells.

10 Claims, 9 Drawing Sheets

PHASE CHANGE MEMORY, WRITING METHOD THEREOF AND READING METHOD THEREOF

This application claims the benefit of U.S. provisional application Ser. No. 61/837,647, filed Jun. 21, 2013, the subject matter of which is incorporated herein by reference.

BACKGROUND

1. Technical Field

The disclosure relates in general to a memory, a writing method thereof and a reading method thereof, and more particularly to a phase change memory, a writing method thereof and a reading method thereof.

2. Description of the Related Art

With the development of technology, varied memories are invented. For example, flash memories, magnetic core memories or phase change memories (PCM) are used in electronic devices.

Phase change memory is a type of non-volatile random-access memory. The material of the PCM maybe, $Ge_2Sb_2Te_5$ (GST), or $GeTe$—$Sb_2Te_3$. The material of the PCM can be switched between a crystalline state and an amorphous state for storing digital data.

SUMMARY

The disclosure is directed to a phase change memory, a writing method thereof and a reading method thereof.

According to a first aspect of the present disclosure, a writing method of a phase change memory (PCM) is provided. The PCM has a plurality of memory cells. The writing method comprises the following steps. At least one stress pulse is applied for aging at least one of the memory cells. A starting pulse is applied to all of the memory cells of the PCM for decreasing a resistance of each memory cell. A detection pulse is applied to all of the memory cells of the PCM for detecting the aged memory cells and the non-aged memory cells. A set pulse is applied to the aged memory cells. The reset pulse is applied to the non-aged memory cells.

According to a second aspect of the present disclosure, a reading method of a phase change memory (PCM) is provided. The PCM has a plurality of memory cells. The reading method comprises the following steps. A starting pulse is applied to all of the memory cells of the PCM for decreasing a resistance of each memory cell. A detection pulse is applied to all of the memory cells of the PCM for detecting the resistance of each memory cell. If the resistance of one of the memory cells is lower than a predetermined value, then the memory cell whose resistance is lower than the predetermined value is determined to be at a low resistance state. If the resistance of one of the memory cells is not lower than a predetermined value, then the memory cell whose resistance is not lower than the predetermined value is determined to be at a high resistance state.

According to a third aspect of the present disclosure, a phase change memory (PCM) is provided. The PCM has a plurality of memory cells. The PCM comprises a pre-coded data and a user data. The pre-coded data is written by applying at least one stress pulse for aging at least one of the memory cells. The user data is written by applying a set pulse or a reset pulse on at least one of the memory cells to be crystalline or amorphous. The user data is independent on the pre-coded data.

The above and other aspects of the disclosure will become better understood with regard to the following detailed description of the non-limiting embodiment(s). The following description is made with reference to the accompanying drawings.

DETAILED DESCRIPTION

Embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
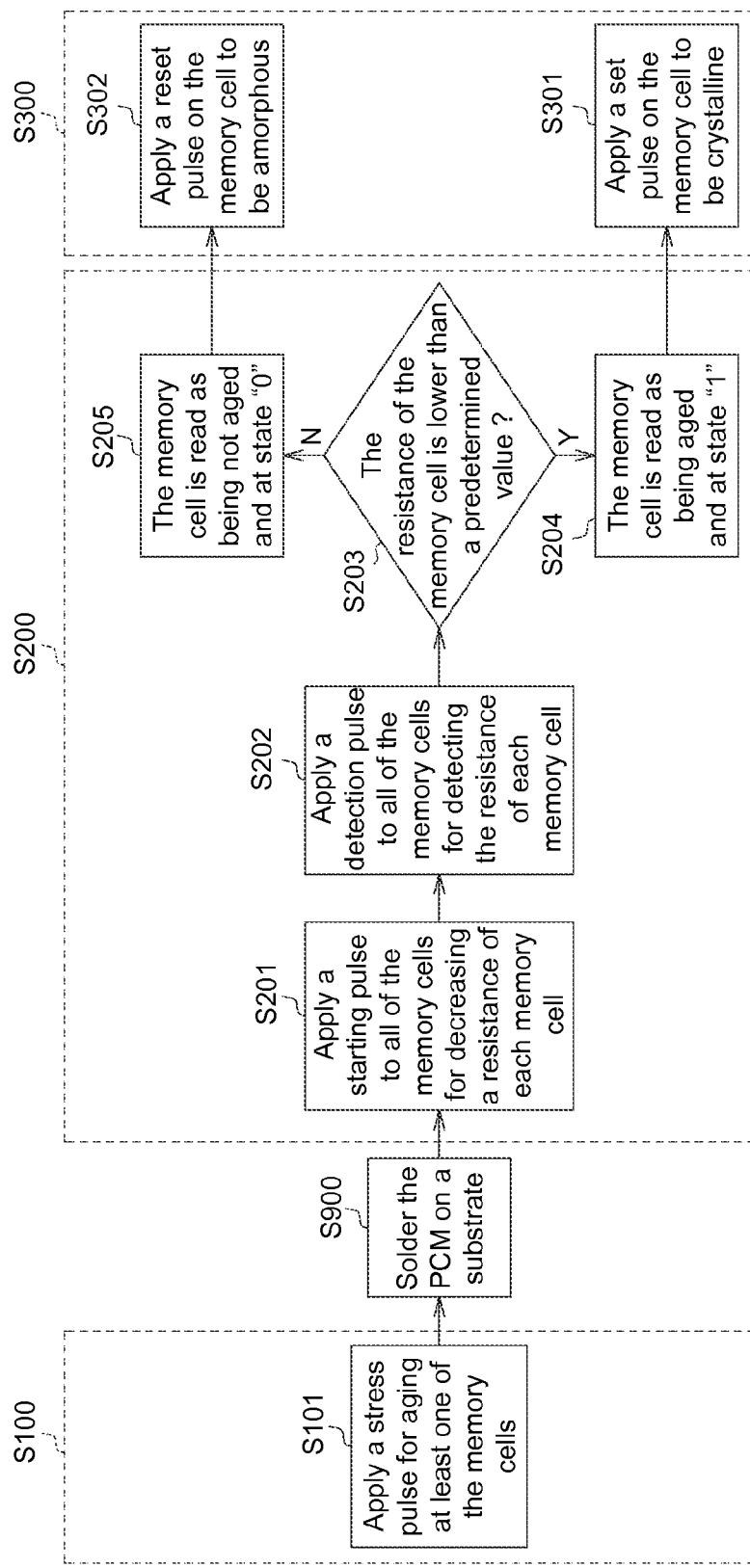
FIG. 1 shows a flowchart of a writing method of a phase change memory (PCM).

FIG. 1 shows a flowchart of a writing method of a phase change memory (PCM). The writing method of the PCM includes a pre-coded data writing procedure S100, a pre-coded data reading procedure S200 and a user data writing procedure S300. The pre-coded data writing procedure S100 is used for writing a pre-coded data into the PCM. The pre-coded data can be remained under an environment which is higher than 300° C. and will not be lost during any high temperature process, such as a soldering process. The pre-coded data reading procedure S200 is used for reading the pre-coded data of the PCM after the high temperature process. The user data writing procedure S300 is used for writing a user data into the PCM after the high temperature process. Because the user data is written after the high temperature process, the user data will not be lost.

The PCM has a plurality of memory cells. For example, each memory cell can be written "0" or "1." In step S101, at least one stress pulse is applied for aging at least one of the memory cells. The at least one of the memory cells which is aged is written as being at state "1." The others of the memory cells which are not aged are defined as being at state "0."

Figure 2:
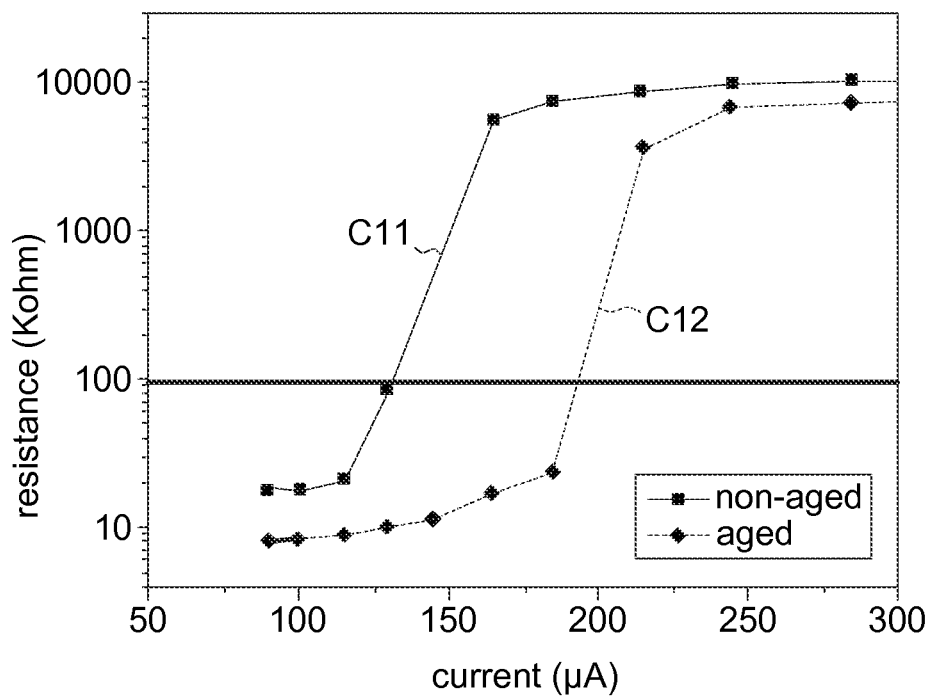
FIG. 2 shows a resistance curve of a non-aged memory cell and a resistance curve of an aged memory cell before a high temperature process.
Figure 3A:
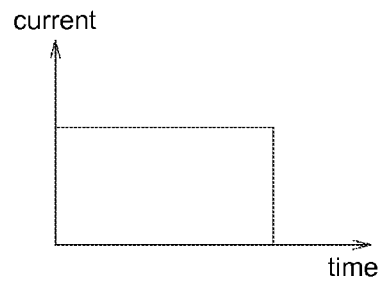
FIGS. 3A to 3F show several embodiments of the stress pulse.
Figure 3B:
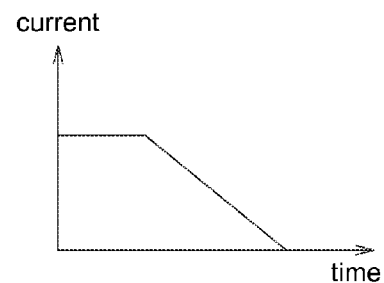
Figure 3C:
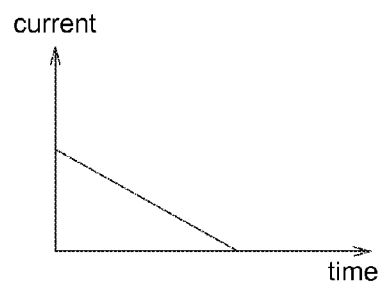
Figure 3D:
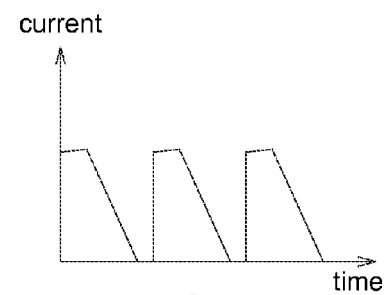
Figure 3E:
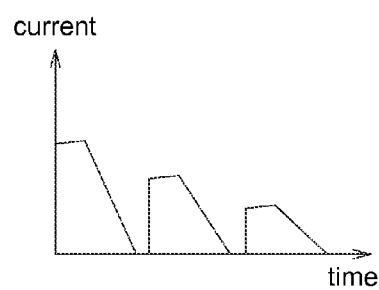
Figure 3F:
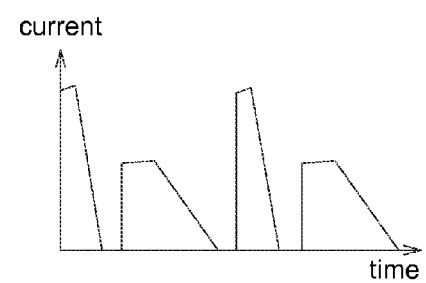

FIG. 2 shows a resistance curve C11 of a non-aged memory cell and a resistance curve C12 of an aged memory cell before a high temperature process. Comparing the non-aged memory cell and the aged memory cell, the resistance curve C11 is different from the resistance curve C12. After the stress pulse is applied, the memory cell is aged and the resistance curve C11 is shifted toward right and becomes the resistance curve C12 and the critical RESET current is increased. That is to say, the minimum current for resetting the memory cell to be at a high resistance state is increased. Taking FIG. 2 as an example, the critical RESET current of the non-aged memory cell is about 145 uA, and the critical RESET current of the aged memory cell is about 215 uA. The difference between the resistance curve C11 of the non-aged memory cell and the resistance curve C12 of the aged memory cell is called an aging effect or a stress effect.

FIGS. 3A to 3F, which show several embodiments of the stress pulse. The total energy of the stress pulse applied on the memory cell is used for aging the memory cell. In one embodiment, the current of the stress pulse can be fixed. In one embodiment, the current of the stress pulse can be decreased. In one embodiment, the current of the stress pulse can be applied as a plurality of pulses.

Figure 4:
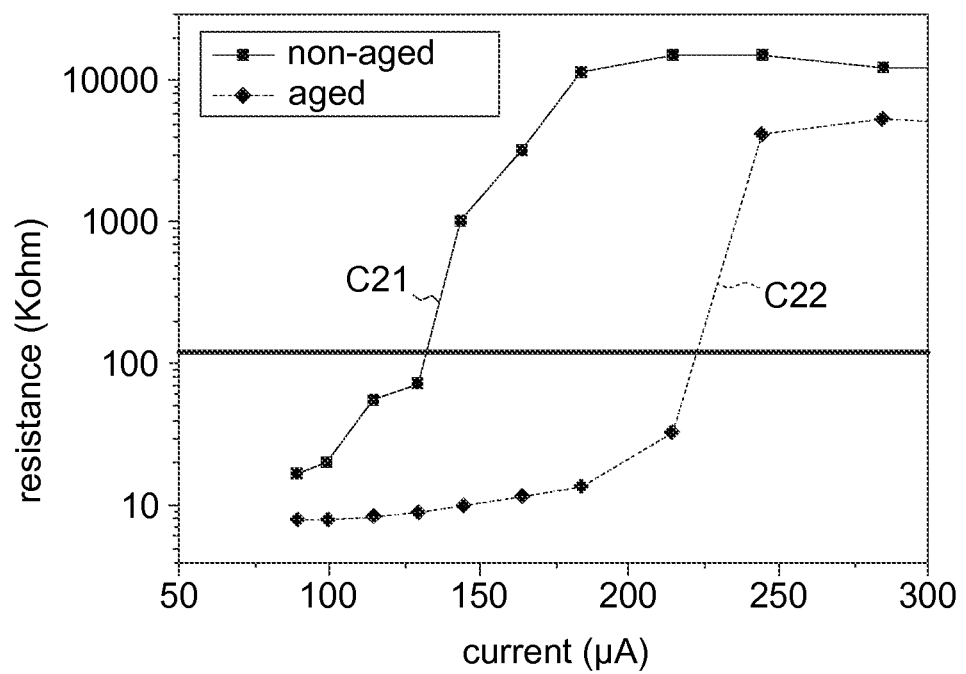
FIG. 4 shows a resistance curve of a non-aged memory cell and a resistance curve of an aged memory cell after a high temperature process.

Referring to FIG. 1, in step S900, the PCM is soldered on a substrate. During the step S900 of soldering, the temperature might be higher than 260° C. Please referring to FIG. 4, FIG. 4 shows a resistance curve C21 of a non-aged memory cell and a resistance curve C22 of an aged memory cell after a high temperature process. Comparing the non-aged memory cell and the aged memory cell, the resistance curve C21 is different from the resistance curve C22. The difference between the resistance curve C21 of the non-aged memory cell and the resistance curve C22 of the aged memory cell is existed. That is to say, the aging effect (or called the stress effect) is still existed after the high temperature process. Therefore, the pre-coded data written by applying the stress pulse will not be lost during the high temperature process.

Please referring to FIG. 1, in step S201, a starting pulse is applied to all of the memory cells of the PCM for decreasing a resistance of each memory cell. Please referring to FIG. 4, for example, the current of the starting pulse may be 100 uA and the resistance of each memory cell is decreased to being lower than a predetermined value, such as 100 Kohm.

In step S202, a detection pulse is applied to all of the memory cells of the PCM for detecting the resistance of each memory cell. The current of the detection pulse is higher than that of the starting pulse. Please referring to FIG. 4, for example, the current of the detection pulse may be 145 to 215 uA, such as 175 uA, and then there is a big difference between the resistance of the non-aged memory cell and the resistance of the aged memory. In this step, the detection pulse may be a 100 to 400 microampere (uA) current applied for 100 ns to 1000 ms.

In step S203, whether the resistance of the memory cell is lower than the predetermined value, such as 100 Kohm, is determined. If the resistance is lower than the predetermined value, then the memory cell is determined to be at a low resistance and the process proceeds to step S204; if the resistance is not lower than the predetermined value, then the memory cell is determined to be at a high resistance and the process proceeds to step S205.

In step S204, the memory cell whose resistance is lower than the predetermined value is read as being aged and at state "1."

In step S205, the memory cell whose resistance is not lower than the predetermined value is read as being not aged and at state "0."

Base on above, by performing the steps S201 to S205, the pre-coded data can be read without being lost after any high temperature process.

Afterwards, in step S301, a set pulse is applied on the memory cell which is read as being aged and at state "1" to be crystalline. When the set pulse is applied on the memory cell, the molecule of the memory is melted. Then, the memory cell is quenched to arrange the molecule. In this step, the current of the set pulse is low and the set pulse is applied for a long time for well arrange the molecule to be crystalline.

In step S302, a reset pulse is applied on the memory cell which is read as being not aged and at state "0" to be amorphous. When the reset pulse is applied on the memory cell, the molecule of the memory is melted. Then, the memory cell is quenched to arrange the molecule. In this step, the current of the reset pulse is high and the reset pulse is applied for a short time for badly arrange the molecule to be amorphous.

Regarding the detection pulse in the step S202, the current of the detection pulse is 50% to 95% of that of the reset pulse. The detection pulse is different from the reset pulse and is different from the set pulse. The detection pulse is not used for making all of the memory cells to be crystalline, and is not used for making all of the memory cells to be amorphous. Actually, the detection pulse will make the non-aged memory cells to be amorphous, and make the aged memory cells to be crystalline.

Regarding the starting pulse in the step S201, the starting pulse may be identical to the set pulse of the step S301. The starting pulse in the step S201 is used for making all of the memory cells to be crystalline. Therefore, the molecule of the memory cells can be rearranged to be crystalline or amorphous in the next step S202.

In other embodiment, the starting pulse may be different from the set pulse of the step S301. The starting pulse can be designed as any form, as long as the molecule of all of the memory cells can be arranged to be crystalline.

Base on above, the PCM comprises the pre-coded data and the user data. The pre-coded data is written by applying at least one stress pulse for aging at least one of the memory cells. The at least one of the memory cells which is aged is at state "1." The others of the memory cells which are not aged are at state "0."

The user data is written by applying a set pulse or a reset pulse on at least one of the memory cells to be crystalline or amorphous. For example, the memory cells which are amorphous are at state "1", and the memory cells which are crystalline are at state "0." The user data and the pre-coded data are independent and can be written or read respectively.

In one embodiment, the pre-coded data may be identical to the user data. In other embodiment, the pre-coded data may be different from the user data. The pre-coded data and the user data can be used for performing some security controlling procedure.

Figure 5:
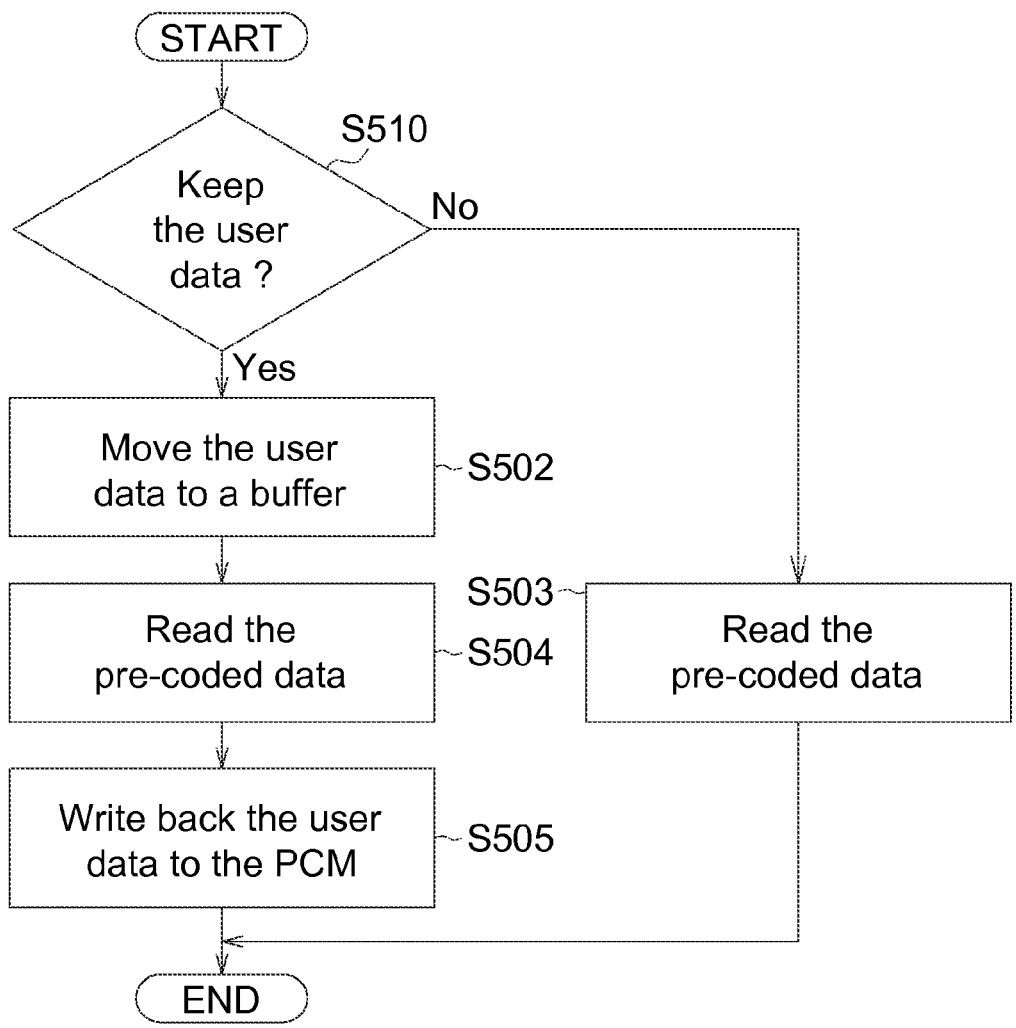
FIG. 5 shows an embodiment for a security controlling procedure of the PCM.

Please referring to FIG. 5, an embodiment for a security controlling procedure of the PCM is shown. In the PCM, the pre-coded data is read by several steps, such as steps S201 to S205 in FIG. 1. The pre-coded data read procedure S200 must be performed by an unusual tool. The usual electronic device cannot read the pre-coded data. Therefore, the pre-coded data can be designed as a security key. FIG. 5 is a procedure for reading this security key.

In step S501, whether the user data is needed to be kept or not is determined. If the user data is needed to be kept, then the process proceeds to step S502; if the user data is not needed to be kept, then the process proceeds to step S503.

In step S502, the user data is moved to a buffer. Because during the pre-coded data reading procedure, the detection pulse will be applied to rearrange the molecule of the PCM, the user data must be moved to the buffer.

In step S504 and S503, the pre-coded data is read by the pre-coded data reading procedure S200. In those steps S504 and 503, the user data of PCM will be lost due to the detection pulse in the pre-coded data reading procedure S200.

In step S505, the user data is written back to the PCM by the user data writing procedure S300. Therefore, even if the user data is lost in the step S504, the user data can be written back by moving the user data to the buffer.

That is to say, the pre-coded data can be designed as a security key that most of the usual electronic devices cannot read. For example, the pre-coded data can be used as an encrypting key, a decrypting key, a verifying key or a biometric key.

Figure 6:
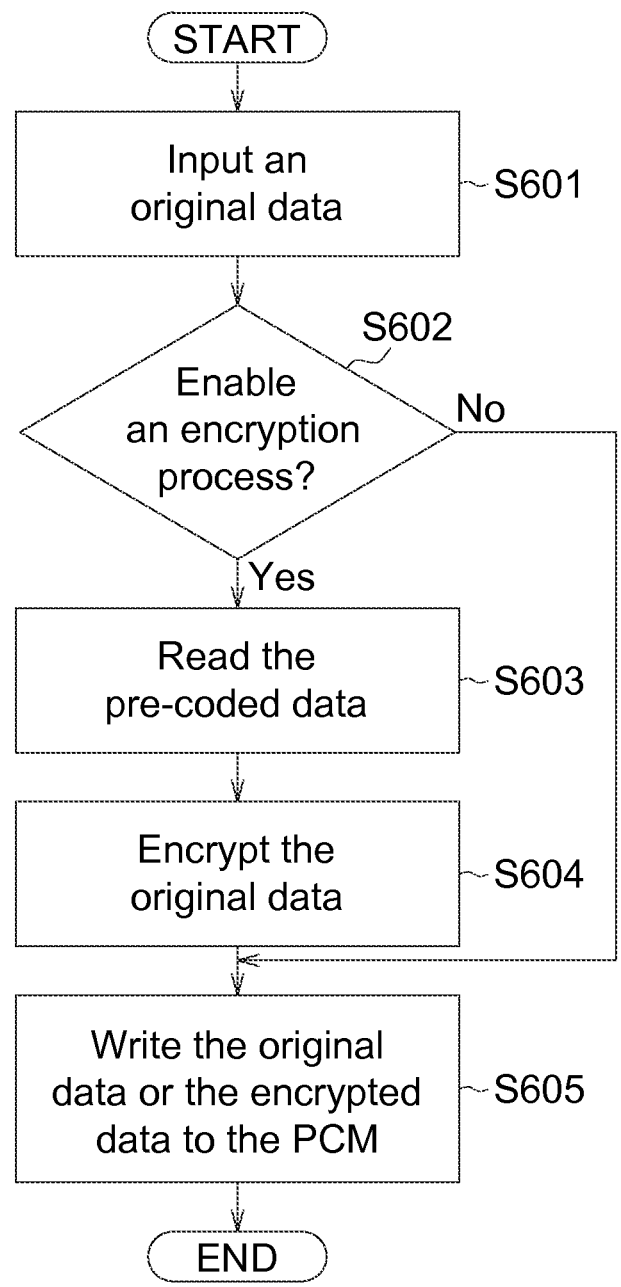
FIG. 6 shows an embodiment for a security controlling procedure of the PCM.

Please referring to FIG. 6, an embodiment for a security controlling procedure of the PCM is shown. In FIG. 6, the pre-coded data is used as an encrypting key. In step S601, an original data to be written is inputted. The original data can be encrypted by the pre-coded data to be an encrypted data.

In step S602, whether an encryption process is enable or not is determined. If the encryption process is enable, then the process proceeds to step S603; if the encryption process is not enable, then the process proceeds to S605.

In step S603, the pre-coded data is read by the pre-coded data reading procedure S200.

In step S604, the original data is encrypted to be the encrypted data according to the pre-coded data. The original data can be encrypted by several calculating process, such as "XOR", "OR", or "NOR."

In step S605, the original data or the encrypted data is written to the PCM by the user data writing procedure S300.

That is to say, the pre-coded data can be designed as an encrypting key. The original data can be encrypted as the encrypted data that the user cannot directly read.

Figure 7:
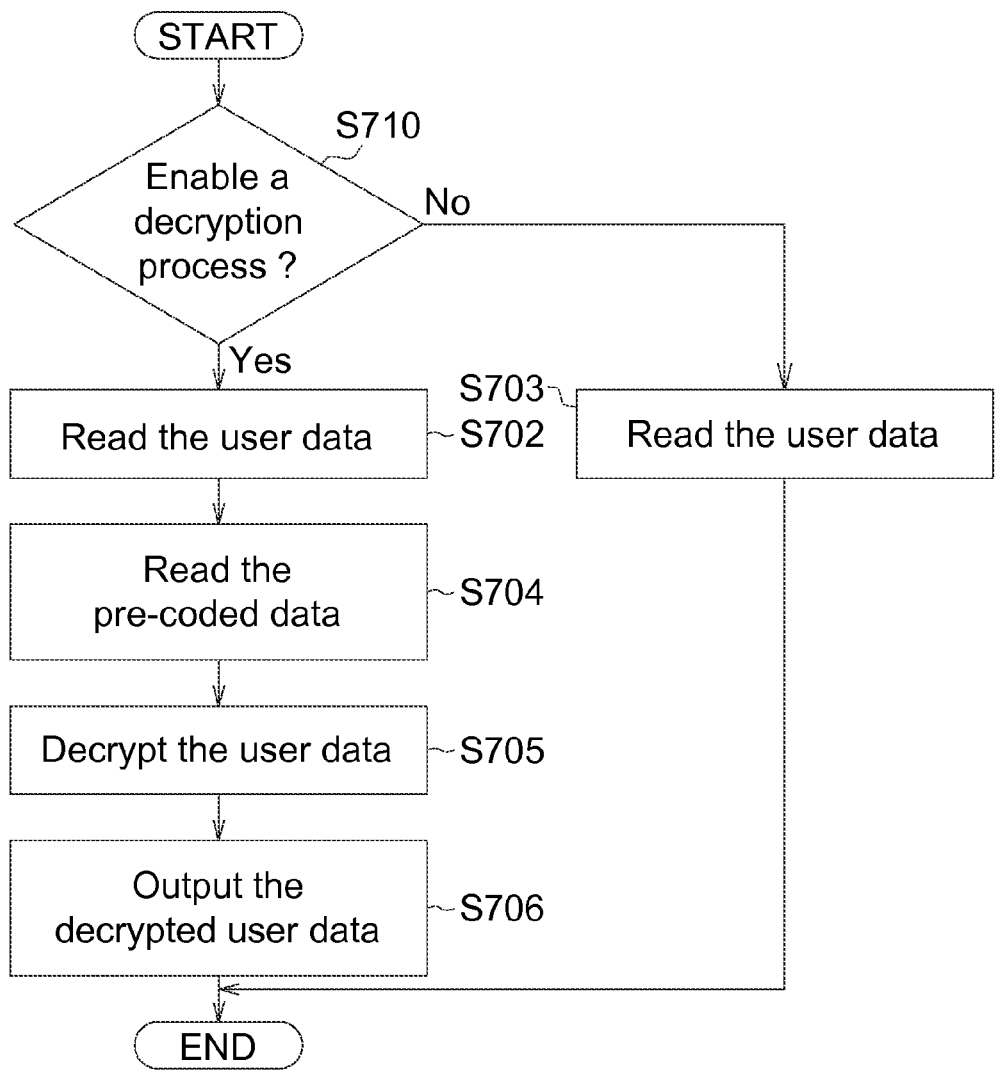
FIG. 7 shows an embodiment for a security controlling procedure of the PCM.

Please referring to FIG. 7, an embodiment for a security controlling procedure of the PCM is shown. In FIG. 7, the pre-coded data is used as a decrypting key. In step S701, whether a decryption process is enable or not is determined. If the decryption process is enable, then the process proceeds to step S702; if the decryption process is not enable, then the process proceeds to step S703.

In steps S702 and S703, the user data is read.

In step S704, the pre-coded data is read by the pre-coded data reading procedure S200. The step S704 is performed after the step S702, therefore the user data can be read before the user data is lost due to the detection pulse.

In step S705, the user data is decrypted to be a decrypted data according to the pre-coded data. The user data can be decrypted by several calculating process, such as "XOR", "OR", or "NOR."

In step S706, the decrypted data or the user data is outputted.

That is to say, the pre-coded data can be designed as a decrypting key. If the user data is an encrypted data, then this user data can be decrypted as the decrypted data that the user can directly read.

Figure 8:
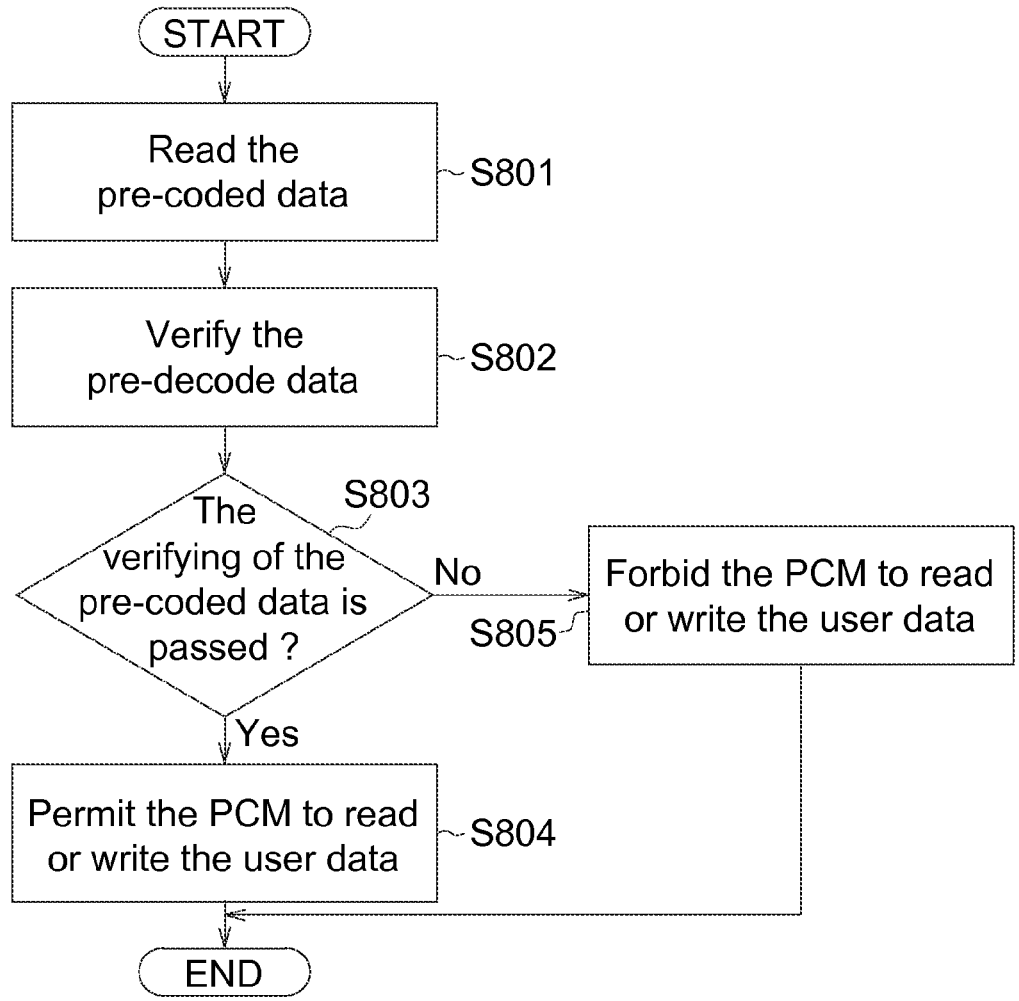
FIG. 8 shows an embodiment for a security controlling procedure of the PCM.

Please referring to FIG. 8, an embodiment for a security controlling procedure of the PCM is shown. In FIG. 8, the pre-coded data is used as a verifying key. In step S801, the pre-coded data is read by the pre-coded data reading procedure S200.

In step S802, the pre-decode data is verified according a particular algorithm. The particular algorithm includes several calculating process, such as "XOR", "OR", or "NOR." For example, the particular algorithm is to verify whether the pre-coded data is "MXIC" or not.

In step S803, whether the verifying of the pre-coded data is passed or not is determined. If the verifying of the pre-coded data is passed, then the process proceeds to step S804; if the verifying of the pre-coded data is not passed, then the process proceeds to step S805.

In step S804, the PCM is permitted to read or write the user data.

In step S805, the PCM is forbidden to read or write the user data.

That is to say, the pre-coded data can be designed as a verifying key. A forgery PCM can be verified for guaranteeing the quality of the product.

Figure 9:
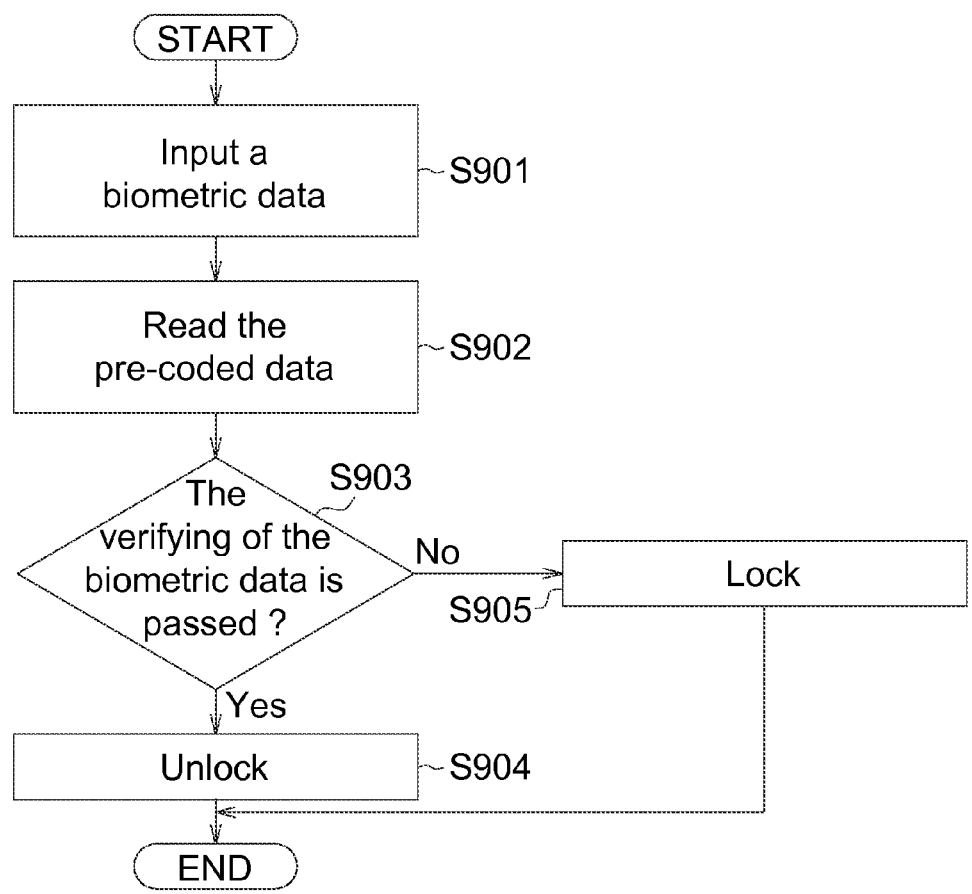
FIG. 9 shows an embodiment for a security controlling procedure of the PCM.

Please referring to FIG. 9, an embodiment for a security controlling procedure of the PCM is shown. In FIG. 9, the pre-coded data is used as a biometric key. In step S901, a biometric data is inputted. For example, the biometric data may be a fingerprint or a voiceprint. In this step, the biometric data is stored in a buffer.

In step S902, the pre-coded data is read by the pre-coded data reading procedure S200.

In step S903, whether the verifying of the biometric data is passed or not is determined according to the pre-coded data. For example, whether the biometric data is similar to the pre-coded data is determined. If the biometric data is similar to the pre-coded data, then the verifying is passed and the process proceeds to step S904. If the biometric data is not similar to the pre-coded data, then the verifying is not passed and the process proceeds to step S905.

In step S904, a key is unlocked.

In step S905, the key is kept being locked. That is to say, the pre-coded data can be designed as a biometric key.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A writing method of a phase change memory (PCM), wherein the PCM has a plurality of memory cells, and the writing method comprises:
applying at least one stress pulse for aging at least one of the memory cells;
applying a starting pulse to all of the memory cells of the PCM for decreasing a resistance of each memory cell;
applying a detection pulse to all of the memory cells of the PCM for detecting the aged memory cells and the non-aged memory cells;
applying a set pulse to the aged memory cells; and
applying a reset pulse to the non-aged memory cells;
wherein the starting pulse is different from the set pulse.

2. The writing method of the PCM according to claim 1, further comprising:
soldering the PCM on a substrate, wherein the step of applying the at least one stress pulse is performed before the step of soldering the PCM.

3. The writing method of the PCM according to claim 1, further comprising:
if the resistance of one of the memory cells is lower than a predetermined value, then the memory cell whose resistance is lower than the predetermined value is read as being aged; and
if the resistance of one of the memory cells is not lower than the predetermined value, then the memory cell whose resistance is not lower than the predetermined value is read as being not aged.

4. The writing method of the PCM according to claim 3, wherein the predetermined value is 100 Kohm.

5. The writing method of the PCM according to claim 1, wherein the step of applying the set pulse and the step of applying the reset pulse are performed after a step of soldering the PCM.

6. The writing method of the PCM according to claim 1, wherein the detection pulse is a 100 to 400 microampere (uA) current applied for 100 ns to 1000 ms.

7. The writing method of the PCM according to claim 1, wherein a current of the detection pulse is higher than a current of the starting pulse.

8. The writing method of the PCM according to claim 1, wherein a current of the detection pulse is 50% to 95% of a current of the reset pulse.

9. The writing method of the PCM according to claim 1, wherein a current of the detection pulse is 145 to 215 uA.

10. The writing method of the PCM according to claim 1, wherein the starting pulse is identical to the set pulse.

\* \* \* \* \*